Figure 1:
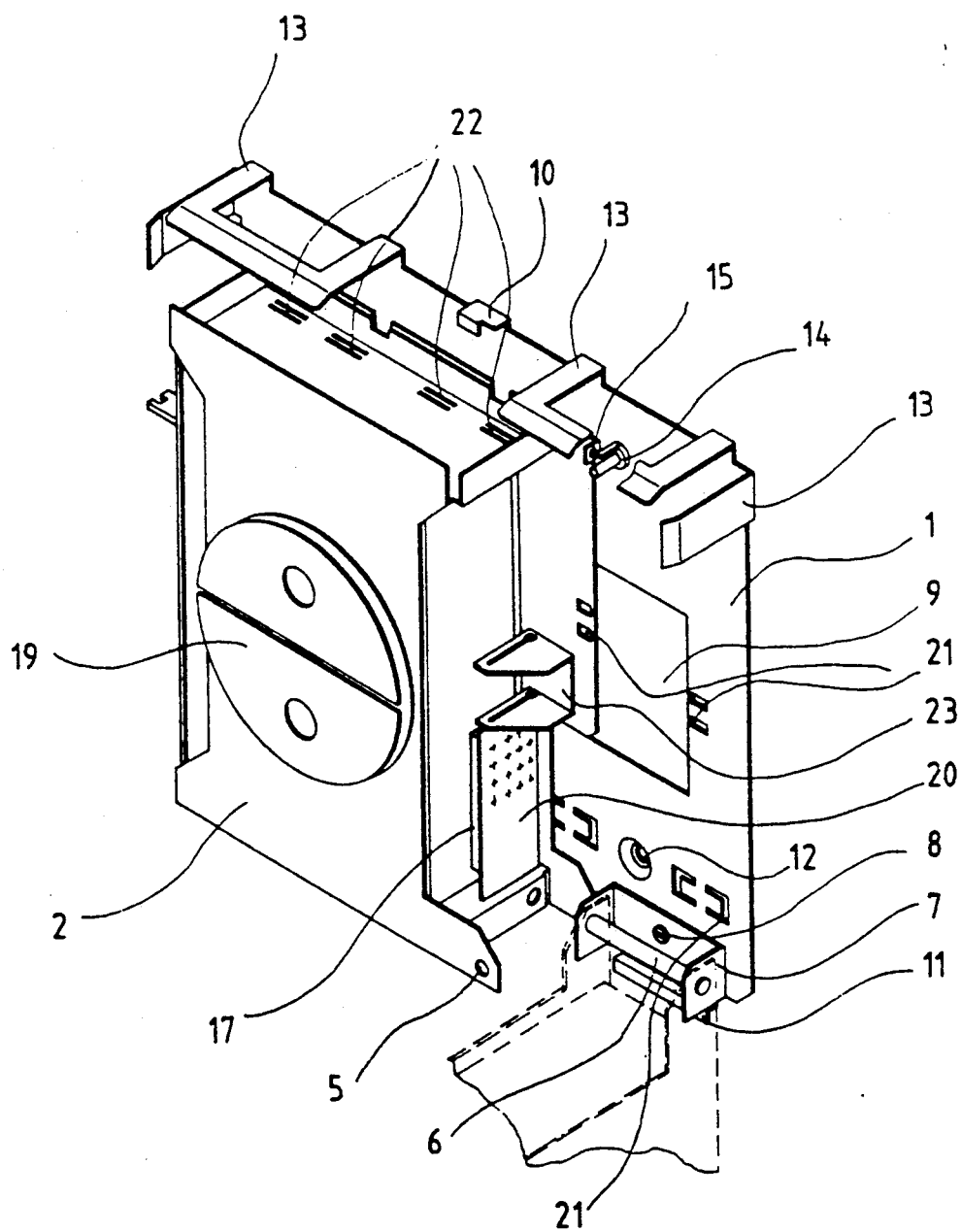

United States Patent [19]
Seitz et al.

[11] Patent Number: 5,181,168
[45] Date of Patent: Jan. 19, 1993

[54] ACCOMMODATION DEVICE FOR ASSEMBLY UNITS

[75] Inventors: Reinhold Seitz, Heroldsberg; Hans-Jürgen Weidner, Winkelhaid, both of Fed. Rep. of Germany

[73] Assignee: U.S. Philips Corporation, New York, N.Y.

[21] Appl. No.: 510,908

[22] Filed: Apr. 18, 1990

[30] Foreign Application Priority Data

Apr. 27, 1989 [DE] Fed. Rep. of Germany ....... 3913923

[51] Int. Cl.$^5$ .............................................. H02B 1/01
[52] U.S. Cl. ..................................... 361/427; 211/41; 361/393; 361/415; 439/62; 439/540
[58] Field of Search ............... 361/331, 332, 333, 340, 361/346, 347, 348, 349, 350, 353, 355, 356, 358, 363, 391, 392, 393, 394, 424, 412, 415, 413, 341; 248/27.1; 220/244, 252; 211/41; 439/44, 47, 298, 372

[56] References Cited

U.S. PATENT DOCUMENTS 4,738,632  4/1988  Schmidt et al. ...................... 361/393

FOREIGN PATENT DOCUMENTS 4010886 10/1990 Fed. Rep. of Germany ........ 439/62
0300424  8/1965 Netherlands ......................... 439/540
2139017 10/1984 United Kingdom ................. 439/76

*Primary Examiner*—Leo P. Picard
*Assistant Examiner*—D. Sparks
*Attorney, Agent, or Firm*—Jack E. Haken

[57] ABSTRACT

A combination for facilitating the assemblage of signal processing equipment in which a first assembly unit can be secured on a base plate either parallel or at right angles to the base plate and wherein a second assembly unit can be arranged at right angles to the base plate.

6 Claims, 2 Drawing Sheets

ACCOMMODATION DEVICE FOR ASSEMBLY UNITS

The invention relates to an accommodation device for assembly units comprising a base plate that can particularly be secured to a wall.

Such accommodation devices are used for communication and data processing systems. An assembly unit that can be secured to a base plate consists, for example, of a receptacle, in which at least one conductor plate or one insert is arranged. The conductor plate or insert has at its front edge indication and operating elements and at its rear edge connector parts, which can be contacted with corresponding mating connector parts. It is desirable to install accommodation devices by securing them to a wall so as to occupy as little room as possible.

The invention has for its object to provide an accommodation device of the kind mentioned in the opening paragraph, which permits both the securing of a single assembly unit so as to occupy as little room as possible and the securing of further assembly units in which a satisfactory accessibility to the assembly units is guaranteed.

This object is achieved in an accommodation device of the kind mentioned in the opening paragraph in that a first assembly unit can be secured on the base plate either parallel or at right angles to the base plate, while beside the first assembly unit there can be secured at right angles to the base plate at least one further assembly unit arranged at right angles to the base plate.

The invention will now be described more fully with reference to the embodiments shown diagrammatically in the drawing.

Figure 2:
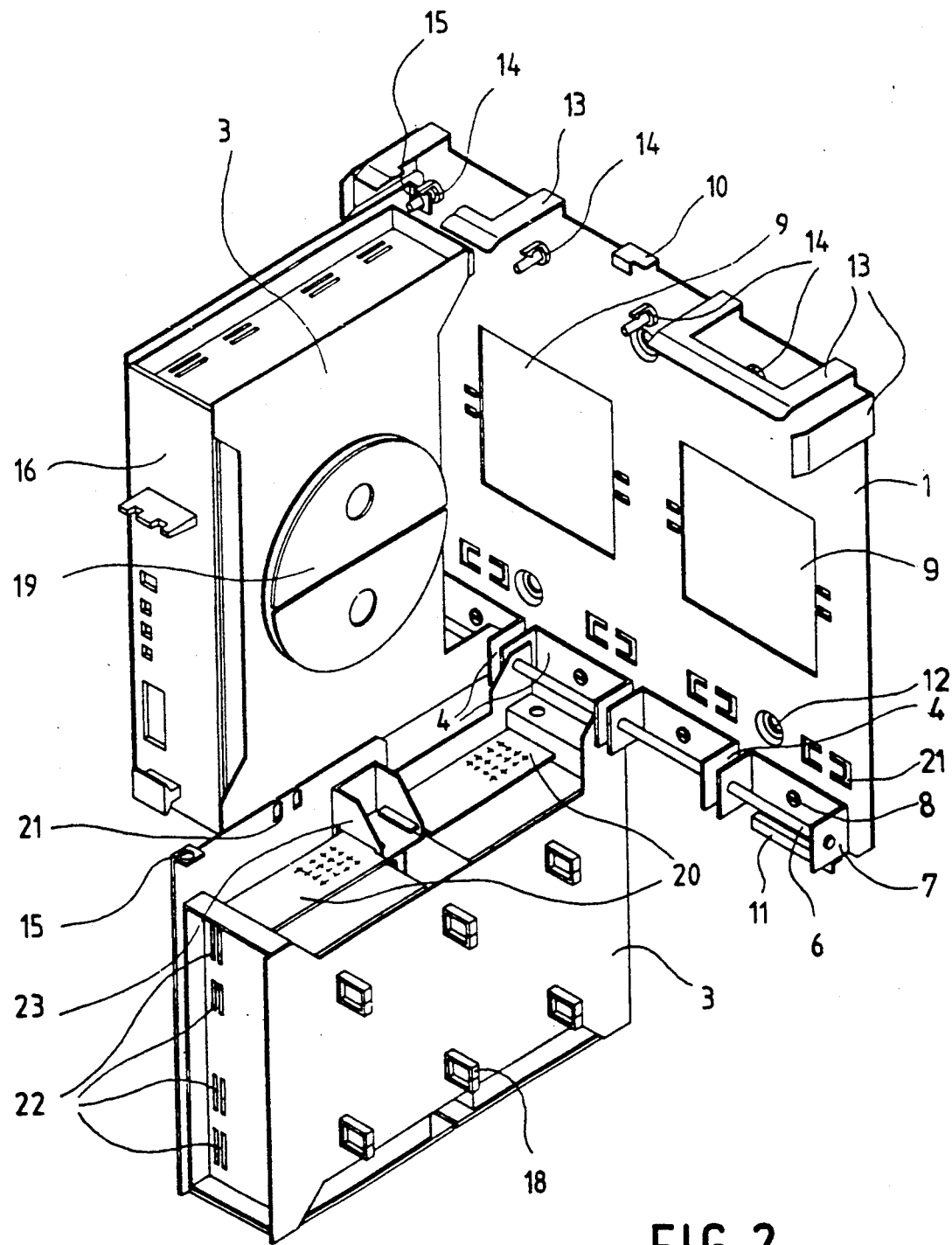

FIG. 1 is a perspective view of an accommodation device comprising a first assembly unit arranged parallel to a base plate, FIG. 2 shows the accommodation device of FIG. 1 with two further assembly units arranged at right angles to the base plate.

FIG. 1 shows an accommodation device with a first assembly unit arranged parallel to a base plate 1. The base plate 1 can be secured, for example, by screws (not shown), that can be passed through threaded holes 12 into a wall. The first assembly unit is constituted by a flat substantially cabinet-shaped receptacle, which is composed of several sheet iron parts joined, for example, by spot welding. Conductor plates provided with components can be inserted into the receptacle 2. For this purpose, the receptacle 2 has on two opposite minor sides guide grooves 22, into which the conductor plates can be inserted. On the back side of the conductor plate particularly in the form of a double Europe printed circuit board is provided a multiple connector part, which upon insertion contacts a multiple mating connector part 17 arranged at the back side of the receptacle 2 on a rear-wall conductor plate 20. The rearwall conductor plate 20 is provided with projections, which are passed on the one hand through a first slot provided in the receptacle 2 and on the other hand through a further slot of a part 23 that can be secured to the receptacle. Instead of the conductor plate in the format of a double Europe printed circuit board, two single Europe printed circuit boards may also be used. For this purpose, intermediate guides not shown in the Figures and a further rear-wall conductor plate 20 provided with multiple connector parts are correspondingly arranged at the receptacle 2 (FIG. 2).

For very stringent requirements with respect to the electromagnetic high-frequency shielding, instead of single conductor plates, a shielded housing in the form of an insert, for example of cast iron, may be accommodated in the first assembly unit 2. A conductor plate provided with a multiple connector part, which is arranged at the rear edge and can be inserted into the multiple mating connector part 17 arranged at the receptacle 2, is then also present in the housing. Connection cables to the mating connector part 17 and, as the case may be, to further, for example optical, connector parts (not shown) arranged at the assembly unit shown in FIG. 1 can through the wall, through cut-out parts 9 of the base plate 1. For guiding the connection cables, the base plate 1 is provided with cable strap fixtures 21 and the receptacle 2 is provided with an accommodation space 19 for cable reserves or with securing brackets 18 (FIG. 2).

The accommodation device shown in FIG. 1 can be provided with a flat covering hood. The covering hood is suspended for this purpose from the lower side with slots arranged at its lower side in projections 11 formed at the edge of the base plate 1 and rectangularly bent and pivoted upwards so that corners 13 formed at the side edges and at the upper edge of the base plate 1 engage the covering hood. The covering hood has a closing member, which is arranged at the upper side and snaps into a locking bracket 10 arranged at the upper edge of the base plate 1.

The accommodation device shown in FIG. 1 permits in a simple manner of securing further assembly units. For this purpose, beside the first assembly unit 2 a first hinge part 7 is arranged on the base plate 1 and the first assembly unit can be secured to this hinge part. The hinge part 7 is formed in the embodiment shown in the Figures by a U-shaped bracket that can be screwed to the base plate 1 by means of a screw 8 and by a pivot shaft 6, which is locked, for example, by means of snap rings. The receptacle 2 of the first assembly unit is provided on its back side in the lower region with hinge eyelets 5, which approximately correspond to the diameter of the pivot shaft 6. In a further embodiment, the receptacle 2 has at the area of the hinge eyelets 5 a pivot shaft 6, which can snap into a corresponding hinge part secured to the base plate 1.

If at least one further assembly unit should be secured to the receptacle shown in FIG. 1, the first assembly unit 2 (=receptacle 2) is unscrewed from the base plate 1 and rotated by 90° so that it is at right angles to the base plate 1 and the hinge eyelets 5 in the hinge part 7 can be correspondingly secured. The first assembly unit 2 thus secured and indicated by broken lines is journalled so as to be pivotable downwards (see FIG. 2) so that the connection leads passed to the mating connector part 17 are readily accessible, for example for maintenance purposes. On the back side of the first assembly unit 2 opposite to the hinge eyelets 5, a snap opening 15 is formed, which, when the assembly unit 2 is pivoted upwards, snaps into a snapping means 14 arranged on the base plate 1. The snap connection can be eliminated without the use of particular auxiliary means so that the single assembly unit can be pivoted downwards. In a favourable embodiment, the base plate 1 or the assembly unit 2 is provided with damping materials, which, when the assembly unit 2 is pivoted downwards, act as an abutment stop or a pull-out device.

FIG. 2 shows the accommodation device of FIG. 1 with two further assembly units 3 arranged at right angles to the base plate 1. The base plate 1 is provided with threaded bores 12 for a wall mounting. Beside the first hinge part 7 and the first assembly unit that can be secured thereto and is not shown in FIG. 2, further hinge parts 4 for securing further assembly units 3 are secured, which in the same manner as the first assembly unit are constructed as a receptacle and can accommodate both single conductor plates and electromagnetically shielded housings provided, for example, with a front plate 16.

The accommodation device shown in FIGS. 1 and 2 permits of securing four assembly units in all, whose snap openings 15 snap, when the assembly units are pivoted upwards, into snapping means 14 arranged correspondingly on the base plate 1.

The accommodation device shown in FIG. 2 with two assembly units can be provided at this finishing stage with a high covering hood, which is constructed in accordance with the dimensions of the assembly housings and advantageously has a viewing surface on the front side.

The accommodation device shown in FIGS. 1 and 2 can therefore be provided in a simple manner so as to occupy little room either with a single assembly unit or with up to four assembly units, a satisfactory accessibility to the connection leads especially of the mating connector part 17 being guaranteed in both cases.

We claim:

1. A combination for facilitating the assemblage of signal processing equipment including a base plate with a substantially flat surface and which is designed to be secured to a wall, a first assembly unit having a longitudinal dimension; first connecting means for attaching the first assembly unit to the substantially flat surface of said base plate with said longitudinal dimension aligned parallel to said substantially flat surface second connecting means for attaching the first assembly unit to the substantially flat surface of the base plate with the longitudinal dimension perpendicular thereto and further comprising a second assembly unit substantially the same structurally as said first assembly unit also having a longitudinal dimension, said second assembly unit being connected to said substantially flat surface of said base plate with its longitudinal dimension being aligned perpendicularly to said flat surface of said base plate.

2. A combination as claimed in claim 1 in which the second connecting means comprises a first hinge part connected to said base plate to which said first assembly unit is securable and also comprising an additional hinge part also connected to said base plate to which said second assembly unit is securable.

3. A combination as claimed in claim 2 wherein said hinge parts each have a pivot shaft and wherein each assembly unit includes hinge eyelets for receiving an associated pivot shaft.

4. A combination as claimed in claim 3 in which said assembly units include snap openings and said base plate includes snapping means which can snap into said snap openings.

5. A combination as claimed in claim 4 wherein said assembly units include cable accommodation devices.

6. A combination as claimed in claim 5 wherein said base plate includes apertures for enabling connection leads to be passed therethrough.

* * * * *